United States Patent [19]

Juul

[11] Patent Number: 4,480,233
[45] Date of Patent: Oct. 30, 1984

[54] PLANAR MULTIPLE OSCILLATOR CIRCUIT

[75] Inventor: Peter A. Juul, Irvine, Calif.

[73] Assignee: Ford Aerospace & Communications Corporation, Detroit, Mich.

[21] Appl. No.: 424,948

[22] Filed: Sep. 27, 1982

[51] Int. Cl.³ .......................... H03B 7/14; H03B 9/14
[52] U.S. Cl. .................................. 331/56; 331/107 P; 331/107 SL
[58] Field of Search .............. 331/56, 107 P, 107 SL, 331/96, 99, 100

[56] References Cited

U.S. PATENT DOCUMENTS

| | | | |
|---|---|---|---|
| 2,658,148 | 11/1953 | Evans et al. | 331/56 |
| 3,252,112 | 5/1966 | Hauer | 331/107 |
| 3,516,008 | 6/1970 | Schlosser | 331/56 |
| 3,582,813 | 6/1971 | Hines | 331/56 |
| 3,628,171 | 12/1971 | Kurokawa et al. | 331/56 |
| 3,659,223 | 4/1972 | Mawhinney | 331/107 R |
| 3,745,479 | 7/1973 | Okabe et al. | 331/56 |
| 3,875,513 | 4/1975 | Strull et al. | 331/107 G X |
| 3,931,587 | 1/1976 | Harp et al. | 331/56 |
| 3,952,262 | 4/1976 | Jamison | 331/55 |
| 3,962,654 | 6/1976 | Corrons et al. | 331/56 |
| 4,143,334 | 3/1979 | Dydyk | 331/56 |
| 4,175,257 | 11/1979 | Smith et al. | 330/287 |

FOREIGN PATENT DOCUMENTS

| | | | |
|---|---|---|---|
| 0017562 | 10/1980 | European Pat. Off. | |
| 55-79508 | 6/1980 | Japan | 331/107 SL |

OTHER PUBLICATIONS

Peterson, "Radial-Symmetric N-Way TEM-Line IMPATT Diode Power Combining Arrays", IEEE Transactions on Microwave Theory and Techniques, vol. MTT-30, No. 2, Feb. 1982, pp. 163 et seq.
Rucker, "A Multiple-Diode High-Average-Power Avalanche-Diode Oscillator", IEEE Transactions on Microwave Theory and Techniques, Dec. 1969, pp. 1156 et seq.
Kurokawa, "An Analysis of Rucker's Multidevice Symmetrical Oscillator", IEEE Transactions on Microwave Theory and Techniques, Nov. 1970, pp. 967 et seq.
"Planar Electrically Symmetric N-Way Hybrid Power Dividers/Combiners", Adel A. M. Saleh, IEEE Trans. on Microwave Theory & Techniques, vol. MTT-28, Jun. 1980, pp. 555–563.

Primary Examiner—Eugene R. Laroche
Assistant Examiner—Robert J. Pascal
Attorney, Agent, or Firm—Edward J. Radlo; Robert D. Sanborn

[57] ABSTRACT

At least two oscillators (20) are power combined using planar transmission lines, e.g., microstrip, stripline, or suspended substrate. A portion (42) of each oscillator (20) is preferably implemented in suspended substrate while an impedance matching portion (24) is preferably implemented in microstrip. Each oscillator (20) comprises a two-terminal negative-resistance active device power source (22) such as a negative resistance diode. The sources (22) are all operated in phase in the even mode. Stabilizing resistors (8) connect adjacent oscillators (20) to keep the sources (22) in phase. A diplexer (29, 33) within each oscillator (20) isolates the RF output (and RF input when injection locking is employed) from the individual DC biases used for sources (22), controls out-of-band impedances, and isolates oscillators (20) from each other. The outputs of the oscillators (20) are summed at a common junction (12) via planar transmission line spokes (10) having equal lengths. In the multi-oscillator embodiment, several oscillators (20) are radially symmetrically oriented around cylindrical junction (12).

7 Claims, 2 Drawing Figures

PLANAR MULTIPLE OSCILLATOR CIRCUIT

DESCRIPTION

1. Technical Field

This invention pertains to the field of combining the power output from several two-terminal negative-resistance active devices, e.g., negative resistance diodes, for use as a transmitter amplifier in radar and communications.

2. Background Art

A prior art search was performed and disclosed the following references:

Peterson, "Radial-Symmetric N-Way TEM-Line IMPATT Diode Power Combining Arrays", *IEEE Transactions on Microwave Theory and Techniques*, Vol. MTT-30, No. 2, Feb. 1982, p. 163 et seq., in FIG. 15 on page 171 shows a radial microstrip circuit for combining several diodes. Differences between the reference and the present invention include: the reference uses lumped circumferential capacitors for DC/RF isolation, whereas the present invention uses planar diplexers; the reference uses lumped LC filters in each DC power supply, while the present invention uses planar lowpass filters; and the planar components of the reference circuit are fabricated entirely in microstrip, whereas the present invention in its preferred embodiment uses suspended substrate for a portion of the circuit. The present invention was made before the publication date of the reference.

Rucker, "A Multiple-Diode High-Average-Power Avalanche-Diode Oscillator", *IEEE Transactions on Microwave Theory and Techiniques*, Dec. 1969, p. 1156 et seq. illustrates in FIG. 9 a two diode embodiment of a radial geometry coaxial transmission line power combining oscillator, as further illustrated in Kurokawa, "An Analysis of Rucker's Multidevice Symmetrical Oscillator", *IEEE Transactions on Microwave Theory and Techniques*, Nov. 1970, p. 967 et seq. The present invention differs from Rucker in that: in Rucker, DC flows through compensating resistors, creating a loss, whereas the present invention does not use resistors in the DC bias path; Rucker uses a common bias, requiring more closely matched diodes than in the present invention, which uses separate biases; Rucker uses bulky capacitive disks for matching, which are not needed in the present invention; and Rucker uses bulky coaxial cable transmission lines for DC and RF transmission to and from each diode. These coaxial transmission lines are more difficult to manufacture and are not as compact as the planar circuitry of the present invention, which can be quickly made and easily mass-produced using photolithographic processes.

Japanese patent 55-79508 is a planar microstrip circuit using dielectric resonators 2a and 2b to set the frequency, making for a narrower bandwidth than in the present invention, where elements 24 and 26 set bandwidth. The reference uses open circuit stub T3 for unwanted mode suppression in lieu of resistors 8 in the present invention, making for a narrower bandwidth. The drawings of this reference show only two oscillators 1a and 1b being combined; it is not known whether single mode operation could be achieved with a greater number of oscillators as in the present invention.

U.S. Pat. No. 3,252,112 discloses connecting a number of tunnel diode microwave generators together to a summing point by means of microwave cavity, waveguide or coaxial transmission lines, not planar transmission lines as in the present invention. The tunnel diodes have a common bias rather than individual biases as in the present invention.

U.S. Pat. No. 3,516,008 is a serial power combiner, not a corporate combiner as in the present invention. Coaxial cable 18 is associated with each oscillator 15, whereas the present invention avoids the use of coaxial cable. Even if the reference were to use just two oscillators, the output would not be taken from a common summing point; this implies higher losses. The reference needs bulky lumped capacitors to tune the circuit; no lumped capacitors are required in the present invention.

U.S. Pat. No. 3,582,813 is a multiple-element combiner not employing planar circuitry. A thick circular plate 111 is cut by radial slots 113, preferably to a depth greater than the penetration of microwave energy, and filled with dielectric to provide combining paths for each of the elements 101, 102, 103, etc.

U.S. Pat. No. 3,875,513 shows several semiconductor oscillators coupled together by means of antennas, not transmission lines as in the present invention.

U.S. Pat. No. 3,952,262 discloses a balanced signal processing circuit fabricated using stripline techniques, and comprises a four-port hybrid junction which can be used to apply a low level injection signal to a pair of oscillators and to combine and couple them to an output terminal. Techniques for combining more than two oscillators are not shown. No mode stability means are provided, implying that the two oscillators must be closely matched in order to achieve efficient power combining.

U.S. Pat. No. 3,962,654 uses coaxial transmission line resonators, not planar circuitry, to power combine microwave diodes.

The following patents all use cavity resonators such as waveguides, and thus use techniques which the present invention intentionally avoids. European Pat. No. 0 017 562; and U.S. Pat. Nos. 2,658,148; 3,628,171; 3,659,223; 3,745,479; 3,931,587; 4,143,334; and 4,175,257.

DISCLOSURE OF INVENTION

The present invention is a circuit which combines two or more oscillators (20) to a common summing junction via equal lengths of planar transmission line. As used herein, "planar transmission line" means microstrip, stripline, or suspended substrate, or combinations or equivalents of two or more of these technologies.

Each oscillator (20) comprises a power source (22) which can be any two-terminal negative-resistance active device, e.g., a negative resistance diode, GUNN diode, or IMPATT diode. All the sources (22) operate in parallel and in phase so that their output powers are combined. Within each oscillator (20) a diplexer formed by a bandpass filter (29) (comprising sections 28 and 30) and a lowpass filter (33) (comprising sections 32 and 34) separates the DC bias from the RF output for each of the power sources (22). An impedance matching section (25) connects each source (22) to the diplexer (29, 33) and provides the proper impedance level for the source (22).

Transmission line spokes (10) having equal length connect each oscillator (20) to a common summing junction (12), where the output powers from all oscillators (20) are combined. In an injection lock embodiment, the injection locking input signal is applied to the summing junction (12) via an input/output port (14), from which the combined output signal is also drawn. In this injection locking embodiment, the input signal and the output signal are isolated from each other, e.g., by means of a circulator (not shown). Adjacent oscillators (20) are each interconnected (at intersections of each (10) and (28)) by stabilizing resistors (8) which assure that each source (22) operates in phase with respect to all other sources (22).

This circuit topology provides many desirable advantages, including:

The short and equal path lengths from the oscillators (20) to the summing junction (12) minimize loss.

DC blocking, bias isolation, out-of-band impedance control, and isolation between oscillators (20) are simultaneously and conveniently accomplished by diplexers (29, 33).

The circuit has a broader bandwidth than the resonant cavity and other combiners described in the above cited references, while maintaining excellent stability via use of resistors (8).

A large number of oscillators (20) can be combined with additive power using the teachings of the present invention.

All components in the circuit, except sources (22), terminations (38), resistors (8), and bias input lines (40) (and, in the case where more than two sources (22) are combined, junction (12) and input/output port (14)), are fabricated using planar transmission line. This allows for compact size and quick and accurate reproducibility using photolithographic techniques.

BRIEF DESCRIPTION OF THE DRAWINGS

These and other more detailed and specific objects and features of the present invention are more fully disclosed in the following specification, reference being had to the accompanying drawings, in which.

DETAILED DESCRIPTION OF THE PREFERRED EMBODIMENTS

Figure 1:
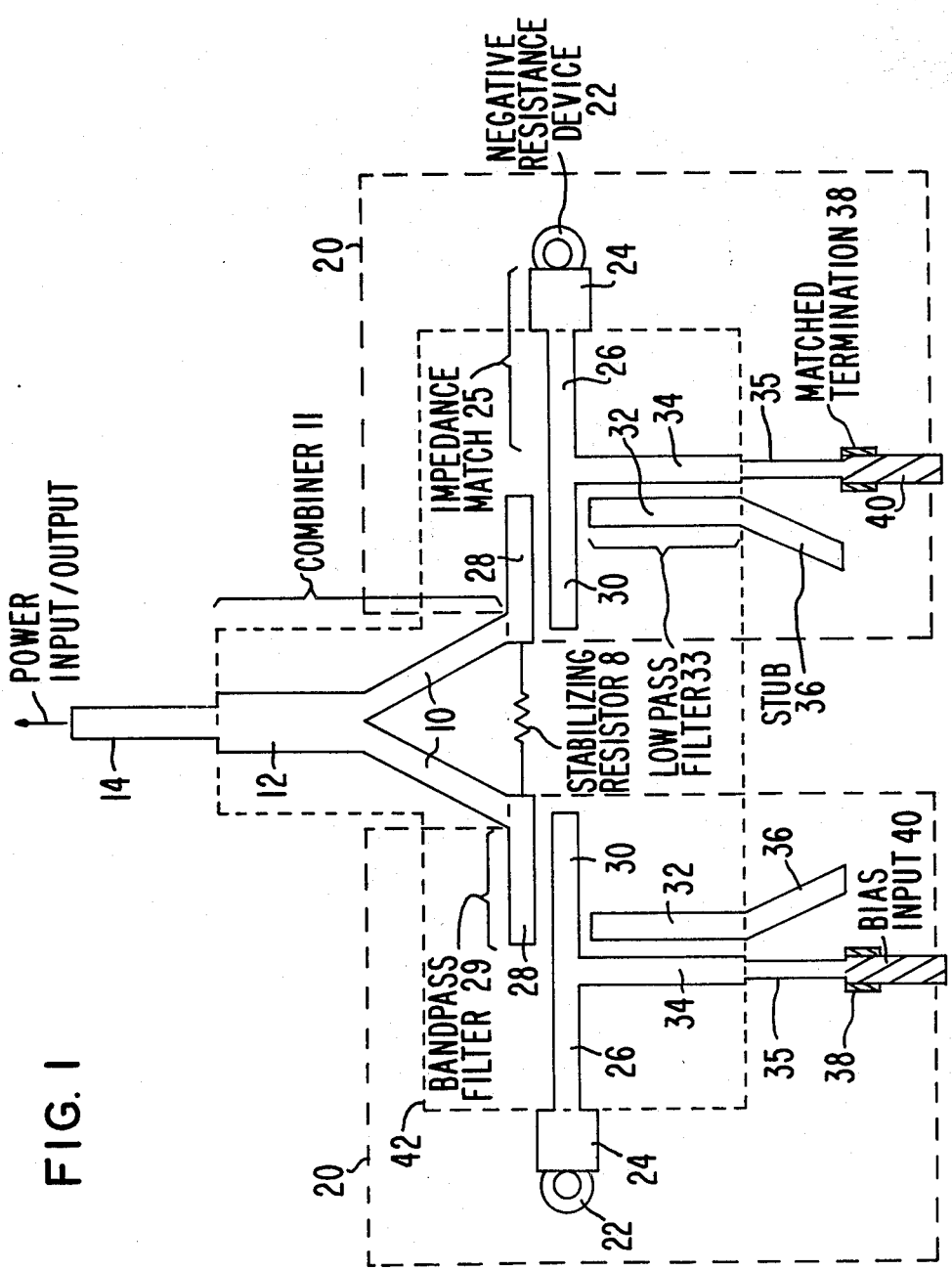
FIG. 1 is a schematic sketch, not to scale, of an embodiment of the present invention where two sources (22) are combined.

Each oscillator 20 comprises source 22 of electromagnetic energy, impedance matching section 25, diplexer 29, 33, stub 36, bias line 35, matched termination 38, and bias input 40.

Sources 22 are any two-terminal negative-resistance active devices, e.g., negative resistance diodes, GUNN diodes, or IMPATT diodes operating at microwave frequencies. All the sources 22 oscillate in parallel and in phase so that their powers combine. FIG. 1 illustrates a two-oscillator embodiment suitable for use at 10 GHz in which sources 22 are IMPATT diodes.

Each diplexer 29, 33 comprises a bandpass filter 29 and a lowpass filter 33. For operation centered around 10 GHz, lowpass filter 33 typically is designed to attenuate frequencies above 7.5 GHz. Each lowpass filter 33 comprises a quarter wavelength resonator 32 and a section 34 spaced apart from resonator 32 which is longer than a quarter of a wavelength and terminates in a bias line 35 and a matched termination 38 fabricated of a material such as Eccosorb TM having a known impedance over a wide RF frequency range. The resonator 32 is open at one end and terminates at its other end in a quarter-wave open circuit stub 36 which flares away from section 34 and creates an RF ground at the intersection of resonator 32 and stub 36.

The combination of bias line 35, matched termination 38 and diplexer 29, 33 controls out-of-band impedances to insure parametric stability of the oscillator 20.

DC bias is applied to bias input 40 which passes through termination 38 and connects with bias line 35 within each oscillator 20. Since each oscillator 20 has a separate bias, the inevitable at least slightly different characteristics of sources 22 can be compensated for. Bias input 40 is typically a cylindrical electrically conductive rod or wire and is shown in cross-section in the drawings, fitting within cylindrical-sleeve-shaped termination 38, which is also shown in cross-section.

Each bandpass filter 29 consist of (1) a quarterwave section 28 open at one end, and connected at its other end to transmission spoke 10 and to a stabilizing resistor 8; and (2) a quarterwave section 30, spaced apart from section 28, open at its end adjacent to spoke 10, and connected at its other end to impedance match 25 and to section 34. Dimensions of sections 28, 30 are normally selected to make the percentage bandwidth of filter 29 about 20% at center frequency. The bandwidth is a compromise between ease of fabrication and low loss. If the bandwidth is designed to be broad, filter 29 is hard to fabricate because of the need for a small gap between components 28 and 30. On the other hand, if filter 29 is designed to have a narrow bandwidth, filter losses increase. In practicality, the bandwidth of the circuit is usually limited by the bandwidth of impedance match 25, the latter bandwidth being a function of the impedance of source 22.

Impedance match 25 matches the impedance between source 22, which frequently has a low, inductive impedance such as $(0.7+j7)$ ohms, and the common connection point between bandpass filter 29 and lowpass filter 33, which in the illustrated embodiment is $12\frac{1}{2}$ ohms and should be purely resistive. Impedance match 25 consists of a low impedance section 24 connected to a quarterwave section 26, a resistive-to-resistive impedance matching transformer that matches said common connection point resistance with the impedance at the section 24/section 26 junction, typically 200 ohms purely resistive. The function of section 24 is to transform the inductive impedance present at its junction with source 22 into a purely resistive impedance at its junction with section 26.

Each oscillator 20 is connected via quarterwave transmission spoke 10 to summing junction 12, which is also a quarter of a wavelength long since it serves as an impedance transformer between input/output port 14 and the common summing point of all the spokes 10.

Input/output port 14 provides an output path for the combined power of oscillators 20, and, in the case where injection locking is employed, also provides an input path for the injection locking signal. In this latter case, the input signal and the output signal are isolated from each other, e.g., by means of a circulator (not shown). The impedance of input/output port 14 is normally the standard 50 ohms. If an injection locking input is not used, the circuit is operated with the sources 22 operating as free-running oscillators, with drift and noise penalties.

Alternative to operating the circuit in oscillator mode, it can be operated as a pure stable reflection amplifier, by means of raising the impedance at each source 22/element 24 junction.

A stabilizing resistor 8 is connected between each oscillator 20 at the node formed by the intersection of transmission spoke 10 and bandpass filter section 28. The purpose of resistor 8 is to keep the sources 22 operating in phase in the even mode: each resistor 8 reflects an unacceptably high impedance when its associated sources 22 are out of phase with respect to each other. Resistor 8 is typically a chip resistor capable of handling high power, e.g., a metal film screened onto a ceramic.

In its preferred embodiment, this circuit is implemented in mixed media, i.e., suspended substrate is used for the components within dotted lines 42, and microstrip is used for matching section 24, bias line 35, and stub 36. Suspended substrate is desirable for diplexer 29, 33 because stability and mode suppression are facilitated when diplexer 29,33 has a high impedance, and suspended substrate is particularly well suited to high impedances. Suspended substrate is preferably used for section 26 because of its high impedance. Microstrip is used for section 24 because it facilitates the realization of the low impedance needed for broadband matching to source 22.

The type of planar circuitry used for components 10, 12, and 14 is not critical; typically, at low frequencies (below 5 GHz) one uses microstrip to keep the physical size small, while at high frequencies (above 5 GHz) suspended substrate is more practical for ease of fabrication. The use of microstrip compared with suspended substrate permits a physical shrinking of the circuit by a factor of approximately $\sqrt{\epsilon}$ where $\epsilon$ is the effective dielectric constant of the planar dielectric used to support the microstrip.

The suspended substrate portion of the circuit includes an air gap within conductive walls but this does not constitute a waveguide because the air gap is intentionally made small enough that no waveguide resonant modes can propagate therewithin.

Suitable values of parameters for 9.3 GHz operation are as follows:

| Component Number | Length (inches) | Width (inches) |
| --- | --- | --- |
| 10 | .297 | .071 |
| 12 | .246 | .120 |
| 24 | .132 | .099 |
| 26 | .301 | .119 |
| 28 | .247 | .037 |
| 30 | .247 | .037 |
| 32 | .247 | .037 |
| 34 | .257 | .037 |
| 35 | .265 | .015 |
| 36 | .215 | .037 |

$\epsilon$ for the dielectric used to support the above components: 2.2. Dielectric thickness: 0.005 inch.

The uniform gap between components 28 and 30: 0.019 inches.

The uniform gap between components 32 and 34: 0.019 inches.

Value of resistor 8: 25 ohms.

Large signal impedance of each IMPATT diode 22: (0.7+j7) ohms.

Figure 2:
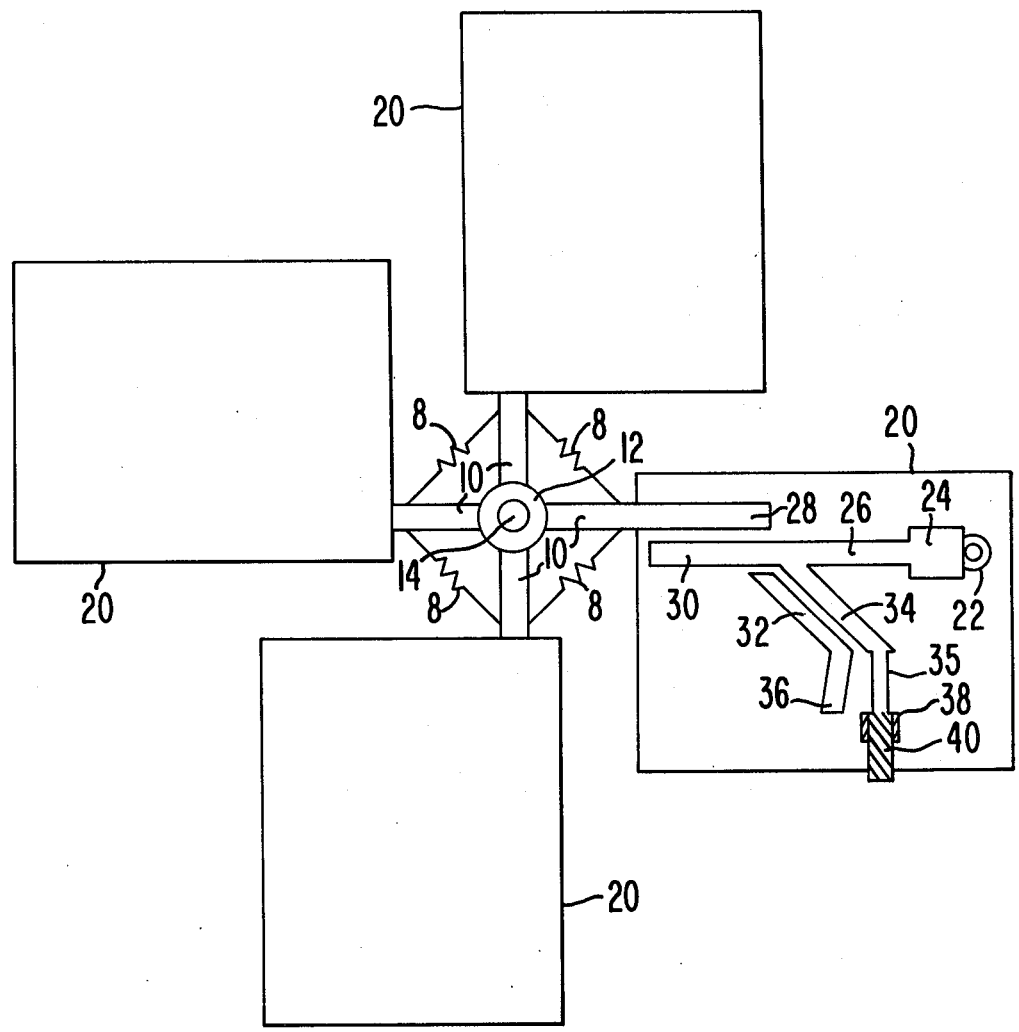
FIG. 2 is a schematic sketch of an embodiment of the present invention in which four sources (22) are combined.

FIG. 2 shows how more than two oscillators 20 are combined. FIG. 2 shows four combined oscillators 20, but an arbitrary number can be power combined in phase, subject only to limitations of physical spacing. All the oscillators 20 lie in the same plane. The components within each oscillator 20 are laid out as in the two source embodiment of FIG. 1. The characteristics of sources 22 should be as identical as possible. Each oscillator 20 is connected via a quarter wave transmission spoke 10 to summing junction 12, which in the multi-diode embodiment is conveniently a quarterwave cylindrical conductor perpendicular to the plane of FIG. 2. Input/output port 14 is then a cylinder usually having a smaller diameter than that of cylinder 12, and is also perpendicular to the page of FIG. 2. An air dielectric surrounds cylinders 14 and 12, formed by a cylindrically-hollowed conductive housing (not shown) which acts as the RF and DC ground for the entire circuit.

A resistor 8 connects each two adjacent oscillators 20 at the point where the filter section 28 connects with its associated spoke 10. All resistors 8 have the same value of resistance.

To determine the value of each resistor 8 for either the two-source or multi-source embodiment, the following heuristic method is performed:

1. Assume a starting value of resistance R for each resistor 8. A value of between 50 ohms and 100 ohms might be appropriate.
2. Measure the complex impedance of each source 22 at several frequencies covering the desired frequency range of operation of the circuit. Plot, e.g., on a Smith chart, a curve connecting, for each of these frequencies, the average value of the impedances of all the sources at that frequency.
3. Using R, calculate (e.g., by using the eigenvalue method) the odd mode load impedance that would be seen by a representative source 22 at its junction with low impedance matching section 24 at several frequencies covering the desired range.
4. Plot on the same chart of step 2 the curve of calculated odd mode load impedance generated in step 3.
5. If the step 4 curve intersects the step 2 curve at any point, change R slightly in a direction that would be expected to avoid the intersection and repeat the above method starting with step 3. If there is no intersection, the latest value of R is incorporated into the circuit.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A circuit for combining the output powers of at least two oscillators, each oscillator comprising a two-terminal negative-resistance active device, said circuit comprising: p1 an electrically conductive common output junction for drawing off said combined output powers;

a planar transmission line spoke connected between each oscillator and the common output junction, wherein all spokes have equal length; and a stabilization resistor coupled between each pair of adjacent oscillators, said resistor having a value to insure, by means of reflecting an unacceptably high impedance when its associated active devices are out of phase with respect to each other, that said active devices do not operate out of phase with respect to each other;

each said oscillator further comprising a diplexer having a first port coupled to the active device, a second port coupled to a DC bias associated with the active device, and a third port coupled to the spoke associated with said oscillator, said diplexer comprising:

a bandpass filter coupled between the associated spoke and the active device, and a lowpass filter having a first port coupled to the active device and a second port coupled to the DC bias via a bias line and a matched termination fabricated of a material having a known impedance over a wide RF frequency range; wherein the combination of the bias line, the matched termination, and the diplexer controls out-of-band impedances to insure parametric stability of the oscillator.

2. The circuit of claim 1 wherein the lowpass filter does not include lumped passive components.

3. The circuit of claim 1 wherein the oscillators lie in the same plane.

4. The circuit of claim 1 wherein an injection input locking signal is fed to each oscillator via the common output junction, the planar transmission line spoke associated with said oscillator, and the bandpass filter associated with said oscillator.

5. The circuit of claim 1 wherein the number of oscillators is greater than two, the oscillators are symmetrically disposed about the common output junction in a single plane, and the common output junction is a cylindrical conductor perpendicular to the plane of the oscillators.

6. The circuit of claim 1 further comprising an impedance match linking the diplexer to the active device; wherein the diplexer comprises suspended substrate, and the impedance match comprises microstrip.

7. A circuit for power combining the outputs from at least two oscillators, each oscillator comprising a two-terminal negative-resistance active device, the circuit further comprising:

a common output junction for drawing off the combined oscillator outputs;

connected between each oscillator and the common output junction, a planar transmission line spoke wherein all spokes have the same length; and a stabilizing resistor connected between each pair of adjacent oscillators, said resistor having a value to insure, by means of reflecting an unacceptably high impedance when its associated active devices are out of phase with respect to each other, that said active devices do not operate out of phase with respect to each other;

wherein the value of each resistor is determined by executing the steps of the following method in the order presented:

assume a starting value of resistance R that is the same for each resistor;

measure the complex impedance of each active device at several frequencies covering the desired operating frequency range of the circuit;

plot on a complex domain chart a curve representing the average value of the active device impedances at each of the measuring frequencies;

using R, calculate at several frequencies covering the desired operating frequency range the odd mode load impedance that would be seen by a representative one of said active devices at its junction with the remainder of its associated oscillator;

plot on said chart a curve of said calculated odd mode load impedance; and if the two curves do not intersect at any point use R, as the value for each stabilizing resistor in the circuit, whereas if the two curves do intersect at any point, change R and reiterate the above method starting with the step of calculating the odd mode load impedance.

* * * * *

UNITED STATES PATENT AND TRADEMARK OFFICE
CERTIFICATE OF CORRECTION

PATENT NO. : 4,480,233
DATED : October 30, 1984
INVENTOR(S) : Peter A. Juul

It is certified that error appears in the above-identified patent and that said Letters Patent are hereby corrected as shown below:

In Col. 6, line 54, delete "p1".

In Col. 8, line 33, after the word "point" insert a --,--.

In Col. 8, line 33, after "R" delete the ",".

Signed and Sealed this

Nineteenth Day of March 1985

[SEAL]

Attest:

DONALD J. QUIGG

Attesting Officer　　Acting Commissioner of Patents and Trademarks